(12) United States Patent
Yang et al.

(10) Patent No.: US 8,686,385 B2
(45) Date of Patent: Apr. 1, 2014

(54) PHASE-CHANGE RANDOM ACCESS MEMORY DEVICE AND METHOD OF MANUFACTURING THE SAME

(75) Inventors: Jin Seok Yang, Ichon-si (KR); Ha Chang Jung, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 192 days.

(21) Appl. No.: 13/337,421

(22) Filed: Dec. 27, 2011

(65) Prior Publication Data
US 2012/0175582 A1 Jul. 12, 2012

(30) Foreign Application Priority Data
Jan. 7, 2011 (KR) .......................... 10-2011-0001761

(51) Int. Cl.
*H01L 29/02* (2006.01)
*H01L 47/00* (2006.01)

(52) U.S. Cl.
USPC ........ 257/2; 257/4; 257/5; 257/288; 438/652; 438/666; 438/629; 438/639; 438/237

(58) Field of Classification Search
USPC ........... 257/2, 3, 4, 5, 42, 773, 296, 288, 367, 257/178, 656, 41, 50, 529, 530; 438/382, 438/381, 54, 666, 102, 197, 478, 593, 584, 438/652, 653, 95, 597, 625, 626, 640, 637, 438/639, 629, 238, 237, 258, 50
See application file for complete search history.

(56) References Cited

U.S. PATENT DOCUMENTS

| | | | | |
|---|---|---|---|---|
| 7,759,667 B2* | 7/2010 | Park et al. | ......................... | 257/3 |
| 7,772,067 B2* | 8/2010 | Lee et al. | ...................... | 438/258 |
| 7,863,173 B2* | 1/2011 | Kang et al. | .................... | 438/584 |
| 2010/0019220 A1* | 1/2010 | Suh | .................. | 257/4 |
| 2010/0327250 A1* | 12/2010 | Park | ..................... | 257/2 |
| 2012/0025162 A1* | 2/2012 | Shin et al. | ......................... | 257/3 |
| 2012/0119181 A1* | 5/2012 | Oh et al. | .......................... | 257/4 |

FOREIGN PATENT DOCUMENTS

| KR | 1020080002500 | 1/2008 |
|---|---|---|
| KR | 1020090036384 | 4/2009 |
| KR | 1020100043470 | 4/2010 |

* cited by examiner

*Primary Examiner* — Thanh Y Tran
(74) *Attorney, Agent, or Firm* — IP & T Group LLP

(57) ABSTRACT

The PCRAM device includes a semiconductor substrate including a switching device; an interlayer insulating layer having a heating electrode contact hole exposing the switching device, a heating electrode formed to be extended along a side of the interlayer insulating layer in the heating electrode contact hole, wherein the heating electrode has a width gradually increased toward a bottom of the heating electrode and is in contact with the switching device, first and second phase-change layers formed within the heating electrode contact hole that includes the heating electrode, and a phase-change separation layer formed in the heating electrode contact hole between the first and second phase-change layers.

12 Claims, 4 Drawing Sheets

PHASE-CHANGE RANDOM ACCESS MEMORY DEVICE AND METHOD OF MANUFACTURING THE SAME

CROSS-REFERENCES TO RELATED APPLICATION

The present application claims priority under 35 U.S.C. 119(a) to Korean application number 10-2011-0001761, filed on Jan. 7, 2011, in the Korean Patent Office, which is incorporated by reference in its entirety as if set forth in full.

BACKGROUND OF THE INVENTION

1. Technical Field

The present invention relates to a nonvolatile memory device, and more particularly, to a phase-change random access memory (PCRAM) device and a method of manufacturing the same.

2. Related Art

PCRAM devices apply joule heat to a phase-change material through a heating electrode serving as a heater, thereby causing the phase-change material to be phase-changed. The PCRAM devices store/erase data using an electrical resistance difference between a crystalline state and an amorphous state of the phase-change material.

A source for supplying heat to the phase-change material is current, and an amount of heat supplied depends on the amount and supply time of the current. The phase-change material has different resistances according to the crystalline state and the amorphous state of the phase-change material, and thus, logic information of the phase-change material is determined by the resistance.

Such a phase-change material may be in partial contact with the heating electrode so that the phase-change material is electrically coupled to the heating electrode.

However, crystalline uniformity in a phase-change material is degraded by a subsequent thermal process, and thus, the degradation of the phase-change material may cause the reliability of an operation between the phase-change material and the heating electrode to be degraded.

When complete separation between the phase-change material and the heating electrode is not obtained, the PCRAM devices are vulnerable to thermal disturbance.

SUMMARY

An embodiment of the present invention is directed to a phase-change random access memory (PCRAM) device with improved reliability of a device operation and a method of manufacturing the same.

According to one aspect of an exemplary embodiment, a PCRAM device includes a semiconductor substrate including a switching device; an interlayer insulating layer having a heating electrode contact hole exposing the switching device; a heating electrode formed to be extended along a side of the interlayer insulating layer in the heating electrode contact hole, wherein the heating electrode has a width gradually increased toward a bottom of the heating electrode and is in contact with the switching device; first and second phase-change layers formed within the heating electrode contact hole that includes the heating electrode; and a phase-change separation layer formed in the heating electrode contact hole between the first and second phase-change layers.

According to another aspect of an exemplary embodiment, a method of manufacturing a PCRAM device includes forming a switching device on a semiconductor substrate; forming an interlayer insulating material on a resultant structure of the semiconductor substrate including the switching device and etching the interlayer insulating material to form an interlayer insulating layer having a heating electrode contact hole exposing the switching device; forming a heating electrode in the heating electrode contact hole, wherein the heating electrode has a width gradually increasing from a top of the heating electrode toward a bottom of the heating electrode; forming first and second phase-change layers formed within the heating electrode contact hole that includes the heating electrode; and forming a phase-change separation layer in the heating electrode contact hole between the first and second phase-change layers.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EXEMPLARY EMBODIMENT

Figure 1:
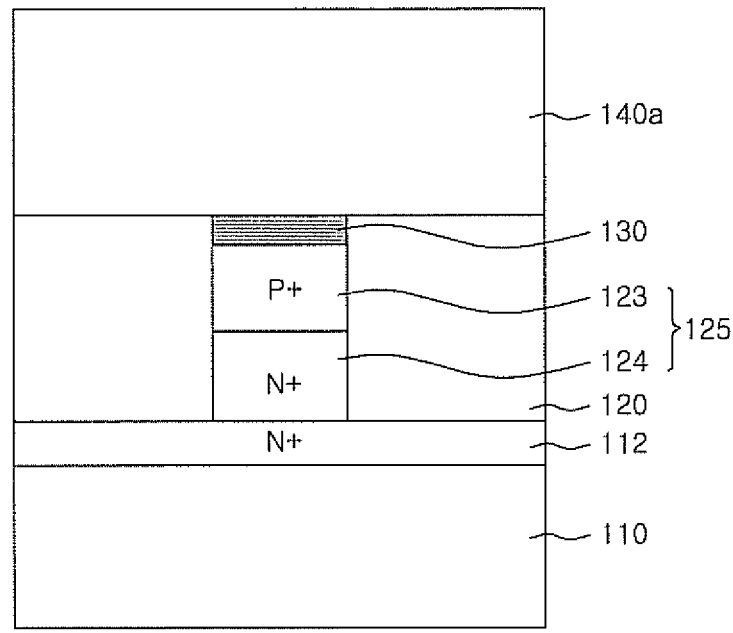
FIGS. 1 to 6 are cross-sectional views sequentially illustrating a method of manufacturing a phase-change random access memory (PCRAM) device according to an exemplary embodiment of the inventive concept.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIGS. 1 to 6 illustrate a method of manufacturing a phase-change random access memory (PCRAM) device according to an exemplary embodiment of the inventive concept.

First, referring to FIG. 1, a switching device 125, a first interlayer insulating layer 120, an ohmic contact layer 130, and a second interlayer material layer 140a are formed on one surface of a semiconductor substrate 110 including an active region 112.

Here, the semiconductor substrate 110 may be, for example, a silicon wafer containing impurities and may be divided into a memory cell area and a peripheral circuit area.

The active region 112 is defined in the memory cell area of the semiconductor substrate 110. For example, the active region 112 may be line-shaped and serve as a word line of the PCRAM device. In addition, the active region 112 may be an n-type impurity region.

The first interlayer insulating layer 120 is deposited on the semiconductor substrate 110 that includes the active region 112, and the first interlayer insulating layer 120 is etched to expose a portion of the active region 112, thereby forming a diode contact hole (not shown).

At this time, the diode contact hole may be formed around an intersection of the active region 112 with a bit line, which is formed later. The switching device may be a diode and is formed within the diode contact hole. In the exemplary embodiment, the diode 125 may be, for example, a PN diode type.

The diode 125 may be formed by forming a p-type selective epitaxial growth (SEG) layer 123 within the diode contact hole and ion implanting p-type impurities into an upper portion of the n-type SEG layer 124.

Alternatively, when a metal word line (not shown) is interposed between the active region 112 and the diode 125, the diode 125 may be implemented with a schottky diode formed of a polysilicon layer.

A transition metal layer (not shown) is deposited on a resultant structure of the semiconductor substrate 110 including the diode 125. A heat treatment is performed on the resultant structure of the semiconductor substrate to selectively form an ohmic contact layer 130 on the diode 125.

The second interlayer material is deposited on a resultant structure of the semiconductor substrate 110 including the ohmic contact layer 130 and the first interlayer insulating layer to form a second interlayer material layer 140a.

Figure 2:
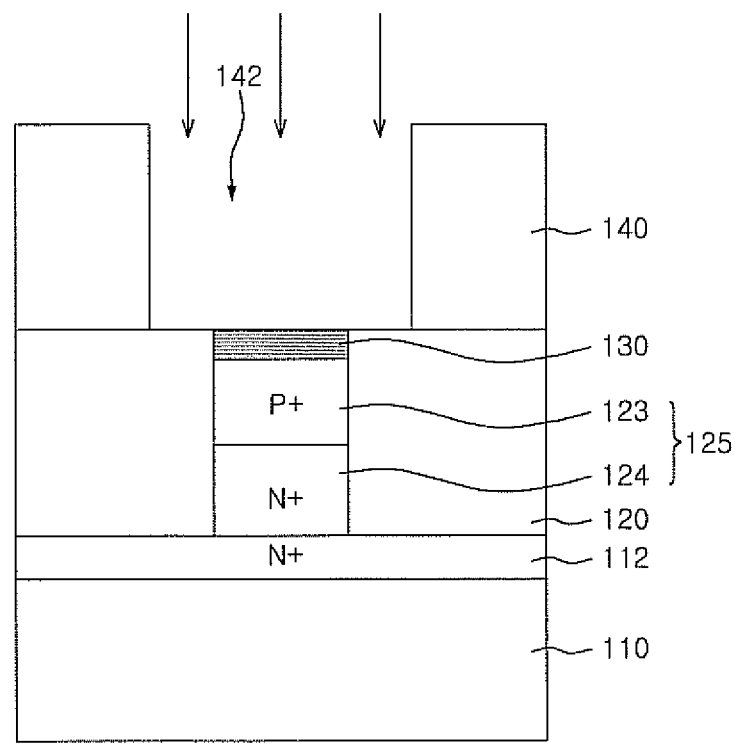

Referring to FIG. 2, a second interlayer insulating layer 140 exposing the diode 125 and a portion of the upper surface of the first interlayer insulating layer 120 is formed.

More specifically, the second interlayer insulating layer 140 is formed on a resultant structure of the semiconductor substrate 110 including the diode 125 and the first interlayer insulating layer 120 by etching the second interlayer material layer 140a to entirely expose a surface of the diode 125 and to expose a portion of a surface of the first interlayer insulating layer 120 that is in contact with a side of the diode 125. Therefore, the second interlayer insulating layer 140 having a heating electrode contact hole 142 is formed on the first interlayer insulating layer 120.

Here, in the exemplary embodiment of the present invention, for example, a width of the heating electrode contact hole 142 is larger than that of the diode 125, but the inventive concept is not limited thereto. The heating electrode contact hole 142 may be formed so that a width of the heating electrode contact hole 142 is the same as that of the diode 125.

Figure 3:
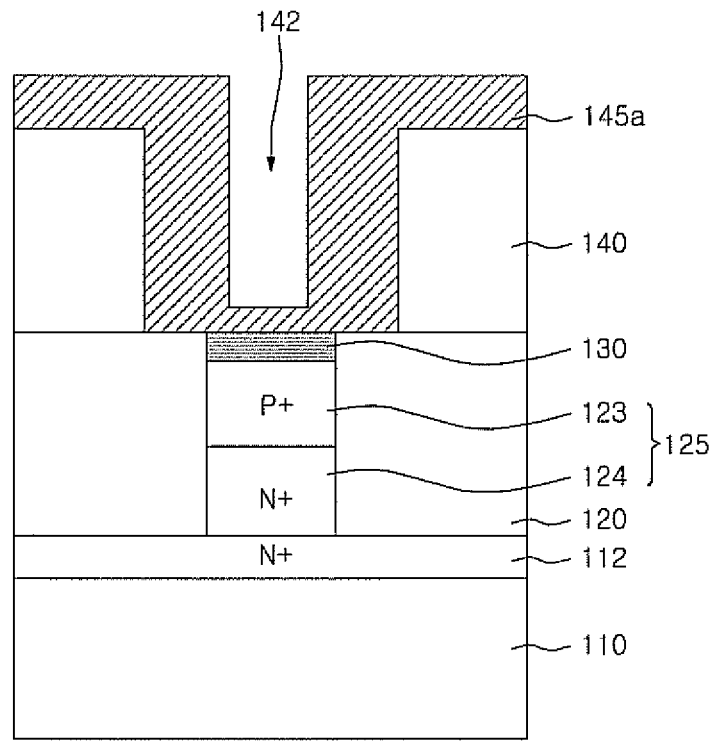

Referring to FIG. 3, a conductive material layer 145a is formed on a resultant structure of the semiconductor substrate 110 including the second interlayer insulating layer 140.

More specifically, a conductive material is deposited on the resultant structure of the semiconductor substrate 110 including the second interlayer insulating layer 140 to form the line type conductive material layer 145a.

At this time, the conductive material layer 145a may include a resistive material. For example, the conductive material layer 145a may include at least any one material selected from the group consisting of a metal layer such as tungsten (W), titanium (Ti), molybdenum (Mo), tantalum (Ta), and platinum (Pt), a metal nitride layer such as titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), and tantalum aluminum nitride (TaAlN), a silicide layer such as titanium silicide (TiSi) and tantalum silicide (TaSi), an alloy layer such as titanium tungsten (TiW), and a metal oxide (nitride) layer such as a titanium oxynitride (TiON), titanium aluminum oxynitride (TiAlON), tungsten oxynitride (WON), tantalum oxynitride (TaON), and iridium oxide layer (IrO$_2$).

Figure 4:
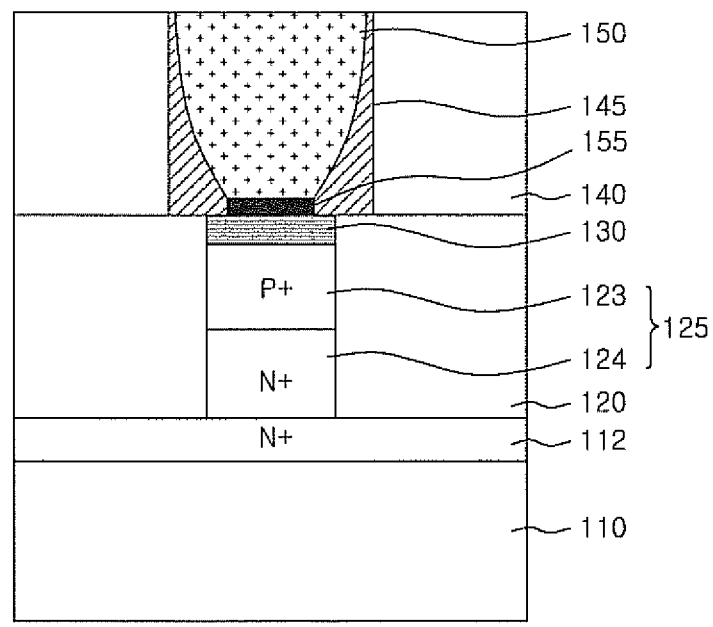

Referring to FIG. 4, a heating electrode 145, a separation layer 155, and a phase-change layer 150 are formed within the heating contact hole 142.

More specifically, the conductive material layer 145a is etched-back to form the heating electrode 145 exposing a surface of the diode 125.

At this time, the heating electrode 145 may be formed so that a lateral side of the heating electrode 145 is in contact with the second interlayer insulating layer 140 and a bottom of the heating electrode 145 is in contact with a portion of a surface of the diode 125 and a portion of a surface of the first interlayer insulating layer 120.

In addition, in the exemplary embodiment of the present invention, the heating electrode 145 may be formed so that the heating electrode 145 formed on the lateral side of the heating electrode contact hole 142 has a width that gradually increases from a top of the heating electrode 145 toward a bottom of the heating electrode 145. This structure is formed because a portion of a material horizontally positioned in regards to the semiconductor substrate 110 is etched faster than a portion of the material vertically positioned in regards to the semiconductor substrate 110 in an etch-back process. Thus, the lateral side of the heating electrode 145, which is in contact with the second interlayer insulating layer 140, is hardly etched, and the portion deposited on the surface of the diode 125 and the surface of the second interlayer insulating layer 140 is largely lost.

An insulating material is deposited on a resultant structure of the semiconductor substrate 110 including the heating electrode 145 and is etched to form the separation layer 155 on a portion of the diode 125 exposed by the heating electrode 145.

The separation layer 155 is formed to completely separate between the phase-change layer 150, which is formed later, and the diode 125 so that the thermal disturbance between the phase-change layer 150 and the diode 125 can be improved.

A phase-change material is deposited on the resulting structure including the separation layer 155, and an etching process and a planarization process are sequentially performed on the phase-change material to form the phase-change layer 150 buried within the heating electrode contact hole 142.

As a deposition method of forming the phase-change layer 150, any one method may be used from the group consisting of a physical vapor deposition (PVD) method, a chemical vapor deposition (CVD) method, and an atomic layer deposition (ALD) method.

However, when a size of the heating contact hole 142 becomes smaller, a CVD method or an ALD method may be used.

Figure 5:
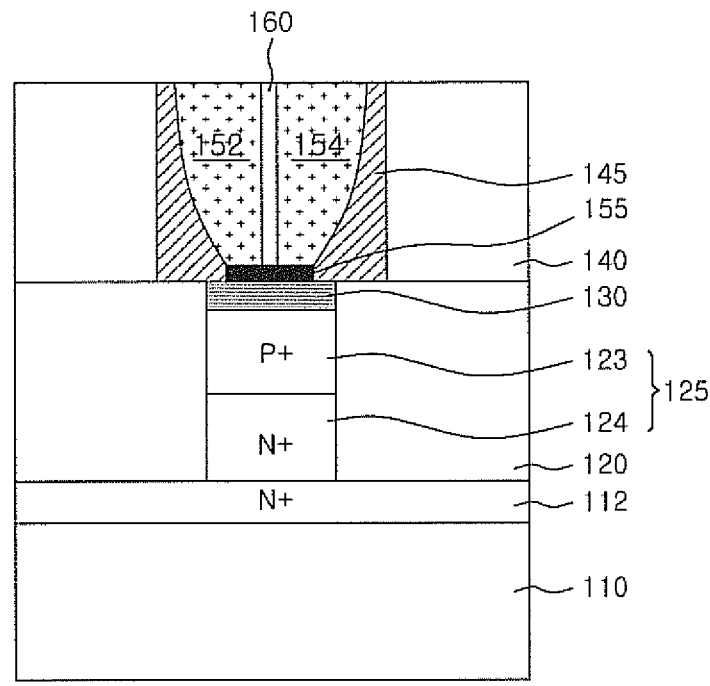

Referring to FIG. 5, a phase-change separation layer 160 is formed to divide the phase-change layer 150 into a first phase-change layer 152 and a second phase-change layer 154.

More specifically, an intermediate region of the phase-change layer 150 is etched to expose a portion of the separation layer 155 and to form a hole (not shown). Next, an insulating material is deposited on a resultant structure of the semiconductor substrate 110 including the hole and planarized to form the phase-change separation layer 160 buried within the hole.

The phase-change separation layer 160 is formed to penetrate the intermediate region of the phase-change layer 150 so that a bottom of the phase-change separation layer 160 is in contact with the portion of the separation layer 155 exposed by the hole.

Thus, the phase-change layer 150 of FIG. 4 is divided into two parts so that the first and second phase-change layers 152 and 154 are formed as shown in FIG. 5.

Therefore, the phase-change separation layer 160 according to the exemplary embodiment allows the phase-change layer 150 to be divided into the first and second phase-change layers 152 and 154 so that a device capacity can be improved and the thermal disturbance can be prevented by intercell insulation separation.

Figure 6:
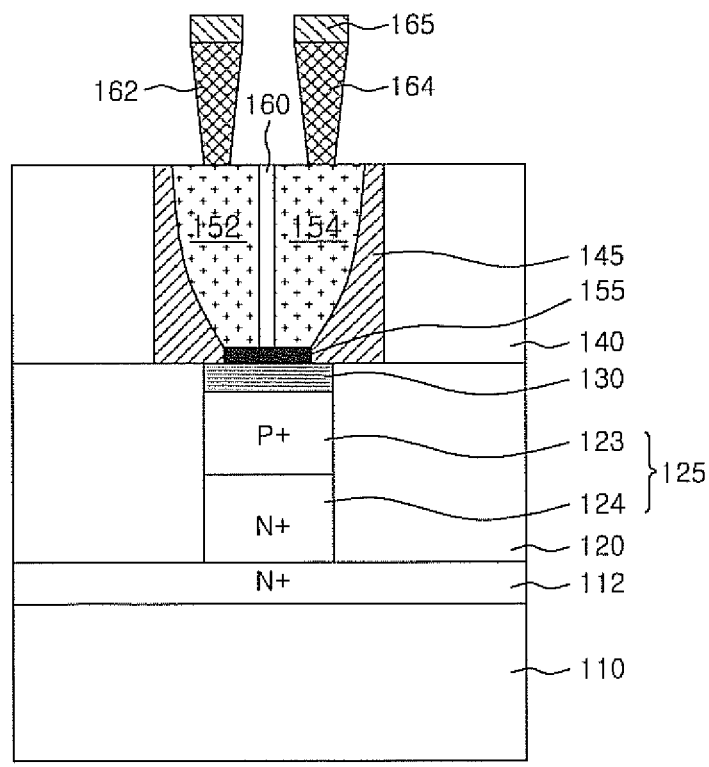

Referring to FIG. 6, a first upper electrode 162 and a second upper electrode 164 are formed on the first and second phase-change layers 152 and 154, respectively. In addition, a metal material is deposited on a resultant structure of the semiconductor substrate 110 including the first and second upper electrodes 162 and 164 and then etched to form a bit line 165.

Figure 7:
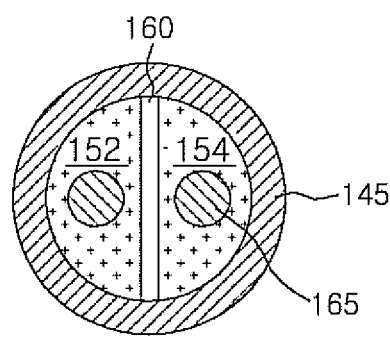
FIG. 7 is a plan view illustrating a PCRAM device according to an exemplary embodiment of the inventive concept.

Two bit lines 165 are formed and as shown in FIG. 7. The bit lines 165 are formed to face each other with the phase-change separation layer 160 being interposed.

As described above, the PCRAM device according to the exemplary embodiment of the present invention forms the phase-change separation layer 160 so that a plurality of phase-change regions can be formed in one active region.

Thus, the PCRAM device and the method of manufacturing the same according to the exemplary embodiment of the present invention can improve the capacity of the device and prevent the thermal disturbance through the intercell insulation separation.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A phase-change random access memory (PCRAM) device, comprising:
    a semiconductor substrate including a switching device;
    an interlayer insulating layer having a heating electrode contact hole exposing the switching device;
    a heating electrode formed to be extended along a side of the interlayer insulating layer in the heating electrode contact hole, wherein the heating electrode has a width gradually increased toward a bottom of the heating electrode and is in contact with the switching device;
    first and second phase-change layers formed within the heating electrode contact hole that includes the heating electrode; and
    a phase-change separation layer formed in the heating electrode contact hole between the first and second phase-change layers.

2. The PCRAM device of claim 1, wherein the heating electrode is formed to expose a portion of the switching device.

3. The PCRAM device of claim 2, further comprising a separation layer formed on the portion of the switching device exposed by the heating electrode.

4. The PCRAM device of claim 1, wherein the phase-change separation layer is formed so that a bottom of the phase-change separation layer is in contact with the heating electrode.

5. The PCRAM device of claim 1, further comprising:
    upper electrodes formed on the first and second phase-change layers, respectively; and
    bit lines formed on the upper electrodes.

6. A method of manufacturing a phase-change random access memory (PCRAM) device, comprising:
    forming a switching device on a semiconductor substrate;
    forming an interlayer insulating material on a resultant structure of the semiconductor substrate including the switching device and etching the interlayer insulating material to form an interlayer insulating layer having a heating electrode contact hole exposing the switching device;
    forming a heating electrode in the heating electrode contact hole, wherein the heating electrode has a width gradually increasing from a top of the heating electrode toward a bottom of the heating electrode;
    forming first and second phase-change layers formed within the heating electrode contact hole that includes the heating electrode; and
    forming a phase-change separation layer in the heating electrode contact hole between the first and second phase-change layers.

7. The method of claim 6, wherein the forming the interlayer insulating layer includes depositing the interlayer insulating material on a resultant structure of the semiconductor substrate including the switching device, and exposing the switching device and a portion of the semiconductor substrate.

8. The method of claim 6, wherein the forming the heating electrode includes:
    forming a conductive material layer by depositing a conductive material on the upper surfaces and sidewalls of interlayer insulating layer and on the upper surfaces of the switching device; and
    forming the heating electrode exposing a portion of a surface of the switching device by performing an etch-back process on the conductive material layer.

9. The method of claim 8, further comprising forming a separation layer by depositing an insulating material on the semiconductor substrate including the switching device and the heating electrode and etching the insulating material so that the insulating material remains on the exposed portion of the surface of the switching device.

10. The method of claim 9, wherein the separation layer is formed by any one selected from the group consisting of a physical vapor deposition (PVD) method, a chemical vapor deposition (CVD) method, and an atomic layer deposition (ALD) method.

11. The method of claim 6, wherein the forming the first and second phase-change layers and the phase-change separation layer includes:
    depositing a phase-change material to be buried within the heating electrode contact hole;
    forming a hole exposing a portion of the switching device by performing an etching process on the phase-change material; and
    depositing an insulating material in the hole and performing a planarization process on the insulating material to form the phase-change separation layer.

12. The method of claim 6, further comprising:
    forming upper electrodes on the first and second phase-change layers, respectively; and
    forming bit lines formed on the upper electrodes.

* * * * *